United States Patent [19]
Choi

[11] Patent Number: 5,834,352
[45] Date of Patent: Nov. 10, 1998

[54] METHODS OF FORMING INTEGRATED CIRCUITS CONTAINING HIGH AND LOW VOLTAGE FIELD EFFECT TRANSISTORS THEREIN

[75] Inventor: Jeong-hyuk Choi, Seoul, Rep. of Korea

[73] Assignee: Samsung Electronics Co., Ltd., Suwon, Rep. of Korea

[21] Appl. No.: 704,266

[22] Filed: Aug. 28, 1996

[30] Foreign Application Priority Data

Aug. 28, 1995 [KR] Rep. of Korea ........................ 95-26917

[51] Int. Cl.⁶ .................... H01L 21/8234; H01L 21/8236
[52] U.S. Cl. ........................... 438/275; 438/231; 438/232
[58] Field of Search ................................... 438/275, 276, 438/279, 287, 216, 231, 232, 168, 217, 218

[56] References Cited

U.S. PATENT DOCUMENTS

| | | | |
|---|---|---|---|
| 5,324,680 | 6/1994 | Lee et al. ................................. | 438/275 |
| 5,432,114 | 7/1995 | O ............................................. | 438/275 |
| 5,449,637 | 9/1995 | Saito et al. ............................... | 438/275 |
| 5,480,828 | 1/1996 | Hsu et al. ................................. | 438/275 |
| 5,576,226 | 11/1996 | Hwang ...................................... | 438/275 |

OTHER PUBLICATIONS

Philip Cacharelis et al., *A 1.0 μm BiCMOS With EEPROM Technology For Application In The Design Of "Smart" Analog And Mixed–Signal ASIC Products*, IEEE 1992 Custom Integrated Circuits Conference, pp. 9.7.1–9.7.4.

*Primary Examiner*—Michael Trinh
*Attorney, Agent, or Firm*—Myers Bigel Sibley & Sajovec

[57] ABSTRACT

Methods of forming integrated circuits containing high and low voltage insulated-gate field effect transistors (IGFET) include the steps of forming first and second insulating layers having unequal thicknesses at first and second locations on a face of a semiconductor substrate, respectively, and then forming first and second gate electrodes on the first and second insulating layers, respectively. Formation of the source and drain regions of a high voltage IGFET is then initiated by implanting first dopants of first conductivity type through the first insulating layer and into the first location, using the first gate electrode as an implant mask. Formation of the source and drain regions (e.g., LDD) of the low voltage IGFET is then initiated by implanting second dopants of first conductivity type into the first and second insulating layers. However, the energy level of the implanted second dopants is set at a relatively low level so that the average projection range of the implanted second dopants is greater than the thickness of the second insulating layer, but less than the thickness of the first insulating layer. Thus, negligible quantities of second dopants become implanted into the already partially formed source and drain regions of the high voltage IGFET. This means that the dose level of the implanted first dopants can be preselected to meet the desired breakdown voltage characteristics of the high voltage IGFET, without contamination by the dopants used to subsequently form the low voltage IGFET.

30 Claims, 5 Drawing Sheets

METHODS OF FORMING INTEGRATED CIRCUITS CONTAINING HIGH AND LOW VOLTAGE FIELD EFFECT TRANSISTORS THEREIN

FIELD OF THE INVENTION

The present invention relates to semiconductor devices and methods of fabrication, and more particularly to integrated circuit semiconductor devices containing high and low voltage field effect transistors therein and methods of forming same.

BACKGROUND OF THE INVENTION

Integrated circuit semiconductor devices may contain circuits therein which are designed to operate at different respective supply voltages. For example, integrated circuit semiconductor devices such as nonvolatile electrically erasable and programmable read-only memories (EEPROM) may contain circuits therein which perform relatively high voltage operations (e.g., 20V), such as programming and erase operations, and relatively low voltage operations (e.g., 5V), such as reading operations. To meet these performance requirements, such circuits typically contain transistors therein which are designed to have either high voltage operating characteristics or low voltage operating characteristics.

Attempts to fabricate high voltage metal-oxide-semiconductor field effect transistors (MOSFET) typically include steps to form what are commonly referred to as double-diffused source (DDS) and drain (DDD) regions. As will be understood by those skilled in the art, these regions can be used to facilitate the formation of MOSFETs having high gate-induced and junction breakdown voltages for operation at 20V or higher. Alternatively, attempts to fabricate low voltage MOSFETs typically include steps to form what are commonly referred to as lightly-doped source (LDS) and drain (LDD) regions. Here, the lightly-doped regions are designed to improve the MOSFETs current drive capability at low voltages around 5V and decrease the generation of relatively high energy ("hot") electrons which can cause premature drain-to-gate breakdown. Examples of integrated circuit semiconductor devices containing both high and low voltage MOSFETs are more fully disclosed in an article by P. Cacharelis et al., entitled *A 1.0 μm BiCMOS with EEPROM Technology for Application in the Design of "Smart" Analog and Mixed-Signal ASIC Products*, Proceedings of the IEEE 1992 Custom Integrated Circuits Conference, Paper 9.7, pp. 1–4 (1992).

One attempt to fabricate integrated circuit semiconductor devices containing both high and low voltage MOSFETs is disclosed by FIGS. 1A–1B. In particular, FIG. 1A generally illustrates the conventional steps of forming a first thermal oxide layer 12 for a high voltage MOSFET and a second thermal oxide layer 14 for a low voltage MOSFET, on a face of a semiconductor substrate 10. For example, the first thermal oxide layer 12 may be formed by oxidizing the face of the substrate 10 to form a layer of oxide having a thickness of about 300 Å. Then, the first thermal oxide layer 12 is removed in the region where the low voltage MOSFET is to be formed, to expose the face. The second thermal oxide layer 14 is then formed by oxidizing the exposed face of the substrate 10 to form a layer of oxide having a thickness of about 120 Å. During this thermal oxidation step, the thickness of the first oxide layer 12 may increase to a thickness of about 350 Å. Although not shown, an ion implantation step may also be performed to adjust the threshold voltages of the low and high voltage MOSFETs to be formed. Referring still to FIG. 1A, a conductive layer is then formed on the first and second oxide layers 12 and 14 and patterned to form gate electrodes 16.

Referring now to FIG. 1B, relatively deep source and drain regions 18 of the high voltage MOSFET are then formed by implanting dopant ions such as phosphorus at a predetermined energy level and a dose level in a range between about $1\times10^{13}$ cm$^{-2}$ and $5\times10^{13}$ cm$^{-2}$ and then diffusing the implanted dopants for about 30 minutes at a temperature of about 950° C. Alternatively, the implant energy level may be increased to reduce the duration and/or temperature of the diffusion step. As will be understood by those skilled in the art, this implantation step is selectively performed in the regions where the high voltage MOSFET is to be formed and the gate electrode 16 of the high voltage transistor is used as an implant mask so that the deep source and drain regions 18 are formed in a self-aligned manner. These steps are then followed by a blanket implantation step at a dose level in a range between about $1\times10^{13}$ cm$^{-2}$ and $5\times10^{13}$ cm$^{-2}$, to form the lightly doped source (LDS) and drain (LDD) regions 20 of the low voltage MOSFET. A blanket oxide layer having a thickness of about 1000–3000 Å is then deposited and etched back using conventional techniques to form oxide spacers 22 on the sidewalls of the gate electrodes 16.

More highly doped contact regions 24 are then formed in the source and drain regions 18 and 20 of the high and low voltage MOSFETs, respectively, by implanting dopant ions such as arsenic at a relatively high dose level in a range between about $2\times10^{15}$ cm$^{-2}$ and $6\times10^{15}$ cm$^{-2}$, using the sidewall spacers 22 as an implant mask to space these contact region from the ends of the gates 16. These contact region dopants are then diffused. Unfortunately, this conventional fabrication method results in the formation of high voltage MOSFETs having less than ideal source and drain region doping profiles. In particular, as illustrated best by FIG. 3, the surface doping concentration of the double diffused drain (DDD) region 18 (in the overlap region underneath the gate electrode 16) is "boosted" to a level of about $1\times10^{18}$ $^{cm-3}$ by the blanket implant step used to form the LDD and LDS regions 20 of the low voltage MOSFET. However, as will be understood by those skilled in the art, this "boosted" surface concentration limits the gate-induced and junction breakdown voltages of the high voltage MOSFETs, by increasing the maximum electric field at the drain-channel junction during high voltage operation.

Referring now to FIGS. 2A–2C, a second attempt to fabricate integrated circuit semiconductor devices having low and high voltage transistors is disclosed. Here, the intermediate structure illustrated by FIG. 2A may be formed using the steps described with respect to FIG. 1A, however, as illustrated by FIG. 2B, the blanket ion implantation step used to form the lightly doped source and drain regions 20 of FIG. 1B is replaced by a selective ion implantation step which uses a patterned photoresist mask 19 to prevent the source and drain regions 18 of the high voltage MOSFET from receiving these additional dopants. Accordingly, the high and low voltage MOSFETs of FIG. 2C are essentially identical to the respective MOSFETs of FIG. 1B, however the surface doping concentrations of the deep drain and source regions 18 (in the overlap region underneath the gate electrode 16) of the high voltage MOSFET are not "boosted" by the dopants used to form the LDS and LDD regions 20 of the low voltage MOSFET. Accordingly, the method of FIGS. 2A–2C does not cause a reduction in the gate-induced and junction breakdown voltages of the high voltage MOSFETs, however an additional step of patterning a photoresist implant mask is required.

Thus, notwithstanding the above described methods, there continues to be a need for improved methods for forming integrated circuit semiconductor devices having high and low voltage transistors therein, which do not require an excessive number of process/masking steps.

SUMMARY OF THE INVENTION

It is therefore an object of the present invention to provide improved methods of forming integrated circuit semiconductor devices containing high and low voltage field effect transistors therein.

It is another object of the present invention to provide methods of forming integrated circuit semiconductor devices containing field effect transistors therein with high junction and gate-induced breakdown voltage characteristics.

It is also an object of the present invention to provide methods of forming low voltage field effect transistors with lightly doped source (LDS) and drain (LDD) regions which are compatible with methods of forming high voltage field effect transistors in the same substrate.

These and other objects, features and advantages of the present invention are provided by improved methods of forming integrated circuits which may contain high and low voltage insulated-gate field effect transistors (IGFET) with respective different current-voltage (I-V) and breakdown voltage characteristics. The high voltage IGFETs may be used in circuitry for performing relatively high voltage (e.g., 20V) programming and erase operations in an integrated circuit memory device and the low voltage IGFETs may be used in circuitry for performing relatively low voltage (e.g., 5V) reading operations, for example.

In particular, a preferred method includes forming first and second insulating layers having unequal thicknesses at first and second locations on a face of a semiconductor substrate, respectively, and then forming first and second gate electrodes on the first and second insulating layers, respectively. Formation of the source and drain regions of a high voltage IGFET is then initiated by implanting first dopants of first conductivity type through the first insulating layer and into the first location, using the first gate electrode as an implant mask. Formation of the source and drain regions (e.g., LDD) of the low voltage IGFET is then initiated by implanting second dopants of first conductivity type into the first and second insulating layers. However, the energy level of the implanted second dopants is set at a relatively low level so that the average projection range of the implanted second dopants is greater than the thickness of the second insulating layer, but less than the thickness of the first insulating layer. Thus, negligible quantities of second dopants become implanted into the already partially formed source and drain regions of the high voltage IGFET. This means that the dose level of the implanted first dopants can be preselected to meet the desired breakdown voltage characteristics of the high voltage IGFET, without contamination by the dopants used to subsequently form the low voltage IGFET. Sidewall spacers can then be formed at opposite ends of the first and second gate electrodes and used as a mask to form relatively highly doped contact portions of the source and drain regions by simultaneously implanting dopants of first conductivity type into the source and drain regions of both the low and high voltage IGFETs.

DESCRIPTION OF PREFERRED EMBODIMENTS

Figure 1A:
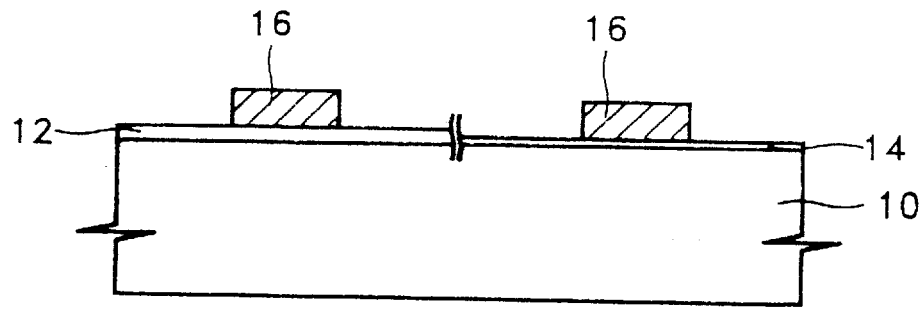
FIGS. 1A–1B illustrate schematic cross-sectional views of intermediate structures illustrating a first method of forming high and low voltage field effect transistors in a semiconductor substrate, according to the prior art.
Figure 1B:
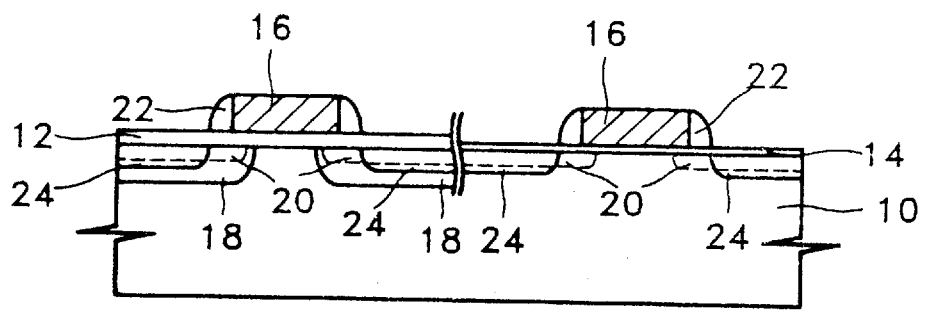
Figure 2A:
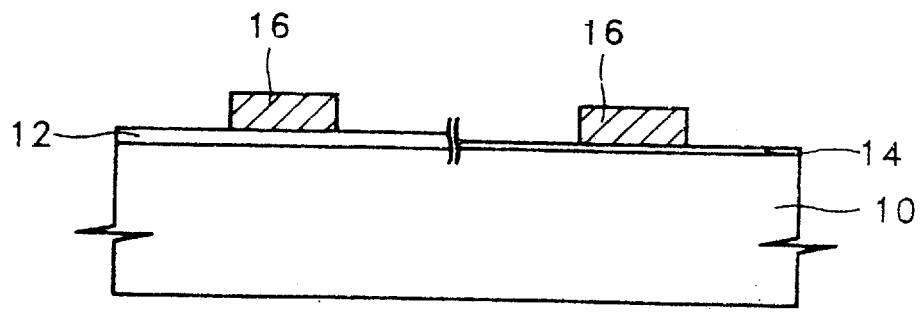
FIGS. 2A–2C illustrate schematic cross-sectional views of intermediate structures illustrating a second method of forming high and low voltage field effect transistors in a semiconductor substrate, according to the prior art.
Figure 2B:
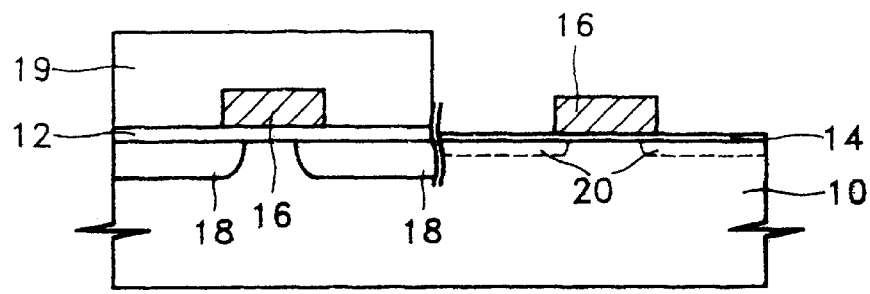
Figure 2C:
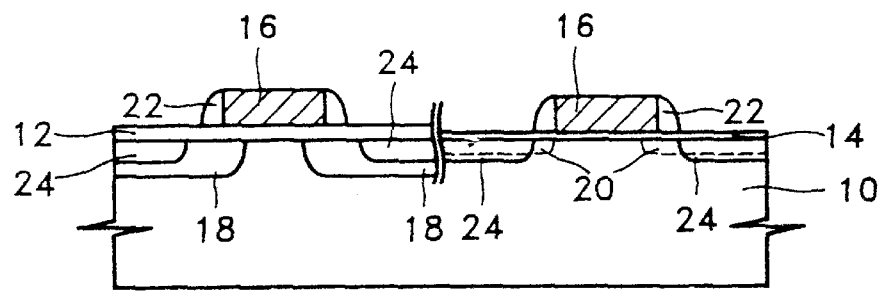
Figure 3:
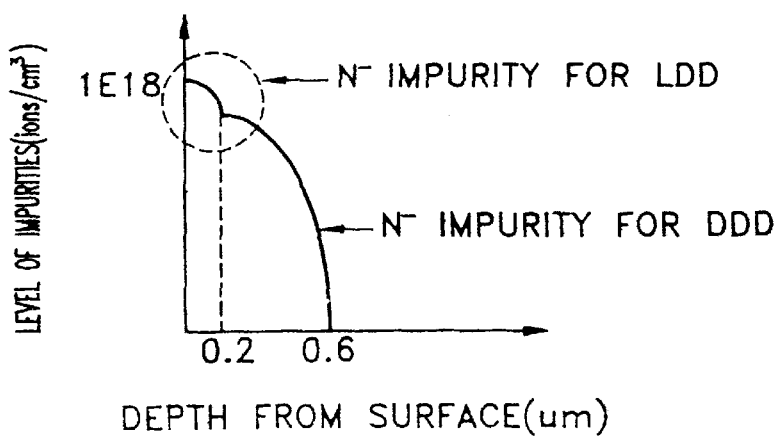
FIG. 3 illustrates a vertical doping profile of a portion of the drain region extending underneath a gate electrode, for the high voltage field effect transistor of FIG. 1B.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as N or P-type and each embodiment described and illustrated herein includes its complementary embodiment as well.

Figure 4A:
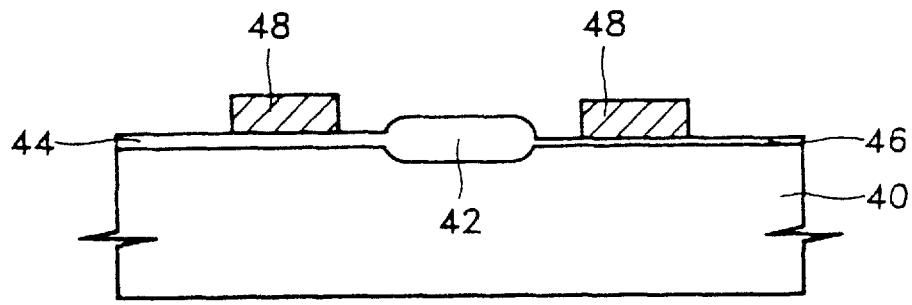
FIGS. 4A–4D illustrate schematic cross-sectional views of intermediate structures illustrating a method of forming high and low voltage field effect transistors in a semiconductor substrate, according to a first embodiment of the present invention.

Referring now to FIGS. 4A–4D, one embodiment of a preferred method of forming an integrated circuit containing a plurality of semiconductor devices having different I-V characteristics, such as high and low voltage IGFETs, will now be described. In particular, FIG. 4A illustrates the steps of forming first and second insulating layers 44 and 46 having unequal thicknesses at first and second locations on a face of a semiconductor substrate 40 of predetermined conductivity type (e.g., P-type), respectively. First and second gate electrodes 48 are then formed on the first and second insulating layers 44 and 46. These steps may be performed by initially forming a field oxide isolation region 42 to define active regions in the substrate, using a conventional technique such as local oxidation of silicon (LOCOS). A threshold voltage of a high voltage IGFET to be formed is then preferably adjusted by forming a sacrificial oxide layer (not shown) having a thickness of about 300 Å on the face of the substrate 40. Threshold adjust dopants (e.g., Boron) are then selectively implanted at a dose level of about $6 \times 10^{11}$ cm$^{-2}$ through the sacrificial oxide layer and into the first location (i.e., active region(s) where the high voltage IGFET(s) is to be formed). The sacrificial oxide layer is then removed to expose a surface relatively free of implant damage.

The first insulating layer 44 (e.g., SiO$_2$) is then partially formed by thermally oxidizing the face of the substrate 40 until an oxide layer having a thickness of about 300 Å has been formed on the face. A threshold voltage of a low voltage IGFET to be formed is then preferably adjusted by selectively implanting threshold adjust dopants (e.g., Boron) at a higher dose level of about 1×10$^{12}$ cm$^{-2}$ through the first insulating layer 44 and into the second location (i.e., active region(s) where the low voltage IGFET(s) is to be formed). The portion of the first insulating layer 44 extending opposite the second location is then removed, using conventional techniques, and then a second insulating layer 46 having a thickness of about 120 Å is formed by thermally oxidizing the face of the substrate 40 at the second location. As will be understood by those skilled in the art, this thermal oxidation step also causes the first insulating layer 44 to increase in thickness to about 350 Å.

The first and second gate electrodes 48 are then formed on the first and second insulating layers 44 and 46, respectively, by depositing a first electrically conductive layer (e.g., polycrystalline silicon) having a thickness of about 1500 Å. This layer may then be doped with phosphorus using phosphorus oxychloride (POCL$_3$) as a dopant source. A second electrically conductive layer (e.g., tungsten silicide (WSi$_x$)) having a thickness of about 1500 Å is then deposited on the first electrically conductive layer to form a composite conductive layer. The composite layer is then etched using a conventional photolithographically defined masking step, to form the first and second gate electrodes 48.

Figure 4B:
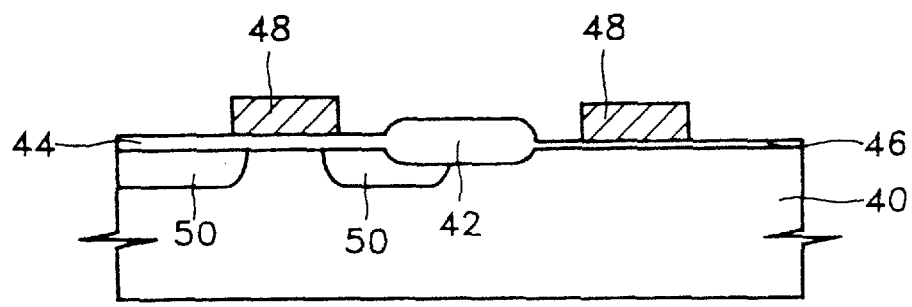

Referring now to FIG. 4B, the deep source and drain regions 50 of the high voltage IGFET are then partially formed at the first location by selectively implanting dopants of first conductivity type (e.g., phosphorus) through the first insulating layer 44 and into the face of the substrate 40, at a dose level in a range between about 1×10$^{13}$ cm$^{-2}$ and 5×10$^{13}$ cm$^{-2}$, and then diffusing these implanted dopants for about 30 minutes at a temperature of about 950° C. Alternatively, the duration of the diffusion step can be reduced or even eliminated by implanting the source and drain region dopants at a relatively high energy level in a range between about 140–200 keV.

Figure 4C:
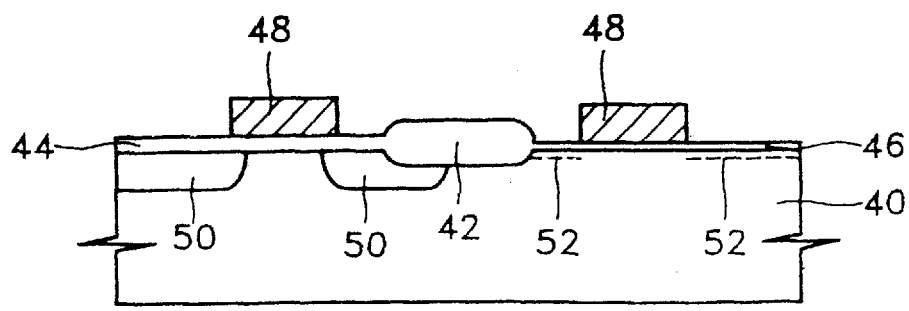

Referring now to FIG. 4C, formation of the relatively lightly doped source (LDS) and drain (LDD) regions 52' of the low voltage IGFET is then initiated by performing a blanket shallow implant of second conductivity type dopants (e.g., arsenic) at a dose level in a range between about 1×10$^{13}$ cm$^{-2}$ and 5×10$^{13}$ cm$^{-2}$ and at an energy level of about 30 keV to form preliminary source and drain regions 52. According to a preferred aspect of the present invention, this blanket shallow implant is preferably performed so that an average projection range (R$_p$) of the implanted dopants is greater than the thickness of the second insulating layer 46 (e.g., 120 Å), but less than the thickness of the first insulating layer 44 (e.g., 350 Å) and most preferably in a range between about 120 Å and 200 Å. Thus, negligible quantities of the dopants used to form the lightly doped source (LDS) and drain (LDD) regions 52' become implanted into the already partially formed source and drain regions 50 of the high voltage IGFET. Therefore, the dose level of the dopants used to form the deep source and drain regions 50 can be preselected to meet the desired breakdown voltage characteristics of the high voltage IGFET, without contamination by the dopants used to subsequently form the low voltage IGFET.

Figure 7:
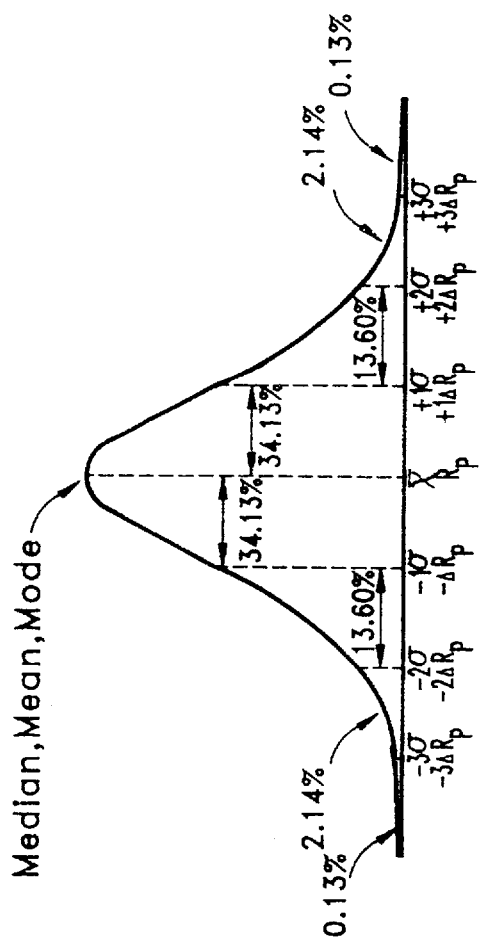
FIG. 7 illustrates a Gaussian distribution profile which approximates a profile of impurities implanted into a substrate.

In particular, because the implant profile of the dopants used to form the preliminary lightly doped source and drain regions 52 of the low voltage IGFET generally approximates a Gaussian distribution, as illustrated best by FIG. 7, the energy level of the implant step can be adjusted (based on the type of dopant ion being used) so that no contamination or only negligible contamination of the deep source and drain regions 50 of the high voltage IGFET will occur. For example, if N-type arsenic ions are implanted at an energy level of about 30 keV, the average projection range of these ions will be about 174 Å with a single standard deviation range (ΔR$_p$) of about 58 Å. Under these conditions, a large process margin is provided because about 84% of the implanted arsenic ions pass through the second insulating layer 46, but only about 1% pass through the first insulating layer 44 because it has a thickness about three standard deviations away from the average projection range (i.e., R$_p$+3ΔR$_p$).

Figure 4D:
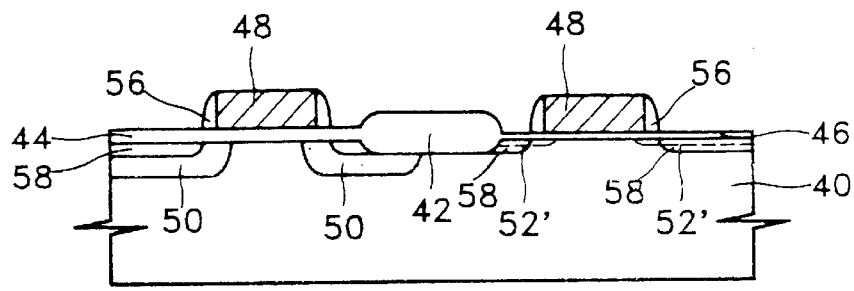
Figure 6A:
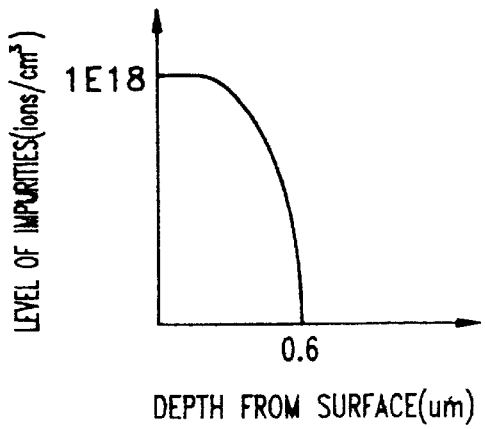
FIGS. 6A–6B illustrates alternative vertical doping profiles of the drain region of the high voltage field effect transistor of FIG. 4D.
Figure 6B:
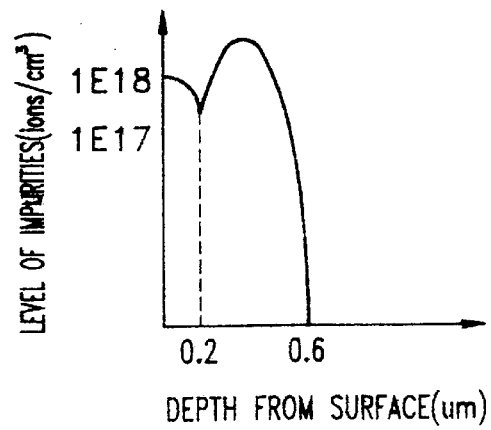

Referring now to FIG. 4D, sidewall spacers 56 (e.g., SiO$_2$) are then preferably formed on the ends of the gate electrodes 48, using conventional techniques. Relatively highly doped source and drain contact regions 58 are then formed in a self-aligned manner by implanting first conductivity type dopants (e.g., phosphorus, arsenic) at a dose level of about 2×10$^{15}$ cm$^{-2}$ using the sidewall spacers 56 as an implant mask, and then activating the dopants through a thermal process. As will be understood by those skilled in the art, the vertical doping profiles of the deep source and drain regions 50, including the source and drain contact regions 58, have the general shape illustrated by FIGS. 6A–6B. In particular, FIG. 6A illustrates the vertical doping profile of the source and drain regions 50/58 of the high voltage IGFET, in the event the diffusion step is performed for 30 minutes at a temperature of about 950° C. Alternatively, FIG. 6B illustrates the vertical doping profile of the source and drain regions 50/58 in the event the deep source and drain region dopants are implanted at a relatively high energy level in a range between about 140–200 keV, so that the average projection range (R$_p$) is substantially greater than the thickness of the first insulating layer 44.

Figure 5:
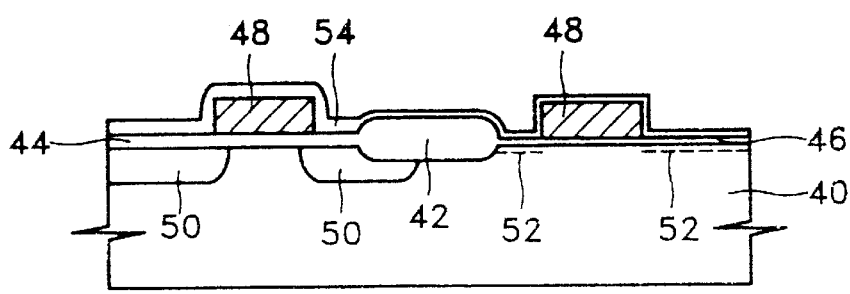
FIG. 5 illustrates a schematic cross-sectional view of an intermediate structure which when combined with FIGS. 4A–4B and 4D illustrates a method of forming high and low voltage field effect transistors in a semiconductor substrate, according to a second embodiment of the present invention.

According to a second embodiment of the present invention, high and low voltage IGFETs may be formed in a preferred manner by substituting the steps illustrated by FIG. 5 with the steps of FIG. 4C. In particular, FIG. 5 illustrates the additional step of forming a third insulating layer 54 by performing a wet oxidation step to form a layer of oxide having a thickness of several hundred angstroms (e.g., >100 Å), on the first insulating layer 44. This additional step may be used in the event the average projection range of the dopant ion (e.g., phosphorus) used to form the lightly doped source (LDS) and drain (LDD) regions 52' is relatively large compared to the preferred thickness of the first insulating layer 44. Moreover, because the wet oxidation rate is typically enhanced when grown on a doped substrate, the wet oxidation step can be performed so that the thickness of the third insulating layer 54 is greater in the region where the high voltage IGFET is to be formed than in the region where the low voltage IGFET is to be formed. Thus, an increase in the ratio of the effective thickness of the first insulating layer 44 relative to the second insulating layer 46 can be achieved by performing a wet oxidation step. Moreover, even if the third insulating layer 54 is etched back prior to implanting the source and drain region dopants for the low voltage IGFET, the increased effective thickness of the first insulating region 44 can be retained. This further limits the extent to which the source and drain region dopants of the low voltage IGFET can contaminate the source and drain regions 50 of the high voltage IGFET by increasing the surface doping concentration in the overlap region underneath the gate electrode. Accordingly, the junction and gate-induced breakdown voltage capability of the high voltage IGFET is not limited by formation of the low voltage IGFET on the same substrate.

Referring again to FIG. 4D, conventional back-end processing steps may also be performed to passivate the substrate, pattern contact vias and metal wiring. In addition, IGFETs of second conductivity type (e.g., P-type) may also be formed using steps similar to the above described steps, by replacing the N-type dopants of arsenic and phosphorus with P-type dopants such as boron and boron-fluoride ($BF_2$).

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a plurality of semiconductor devices, comprising the steps of:
    forming first and second insulating layers having unequal thicknesses at first and second locations on a face of a semiconductor substrate, respectively;
    forming a first gate electrode of a first semiconductor device on the first insulating layer, opposite the first location;
    forming deep source and drain regions of the first semiconductor device by implanting source and drain region dopants of first conductivity type through the first insulating layer and into the first location, using the first gate electrode as an implant mask; and
    forming an active region of a second semiconductor device at the second location by implanting active region dopants of first conductivity type at a predetermined energy level into the first and second insulating layers so that an average projection range of the implanted active region dopants is greater than the thickness of the second insulating layer but less than the thickness of the first insulating layer.

2. The method of claim 1, further comprising the steps of forming sidewall spacers at ends of the first gate electrode; and implanting dopants of first conductivity type into the deep source and drain regions using the sidewall spacers on the first gate electrode as an implant mask.

3. The method of claim 2, wherein said step of implanting dopants of first conductivity type into the deep source and drain regions comprises implanting dopants of first conductivity type through the second insulating layer and into the active region.

4. The method of claim 2, wherein said first gate electrode forming step comprises forming a second gate electrode on the second insulating layer, opposite the second location; and wherein said active region forming step comprises forming shallow source and drain regions adjacent ends of the second gate electrode by implanting dopants of first conductivity type into the second location, using the second gate electrode as an implant mask.

5. The method of claim 4, wherein said sidewall spacers forming step comprises forming sidewall spacers on the ends of the second gate electrode.

6. The method of claim 5, wherein said step of implanting dopants of first conductivity type into the deep source and drain regions comprises implanting dopants of first conductivity type into the shallow source and drain regions using the sidewall spacers on the second gate electrode as an implant mask.

7. The method of claim 1, wherein said step of forming deep source and drain regions comprises implanting source and drain region dopants at a dose level in a range between about $1\times10^{13}$ $cm^{-2}$ and $5\times10^{13}$ $cm^{-2}$ and then diffusing the source and drain region dopants at a temperature of about 950° C. form about 30 minutes.

8. The method of claim 1, wherein said step of forming deep source and drain regions comprises implanting source and drain region dopants at a dose level in a range between about $1\times10^{13}$ $cm^{-2}$ and $5\times10^{13} cm^{-2}$ and at an energy level in a range between about 140 and 200 keV.

9. The method of claim 1, wherein said active region forming step comprises implanting arsenic ions at a dose level in a range between about $1\times10^{13}$ $cm^{-2}$ and $5\times10^{13}$ $cm^{-2}$ and at an energy level of about 30 keV.

10. The method of claim 4, wherein said active region forming step comprises implanting arsenic ions at a dose level in a range between about $1\times10^{13}$ $cm^{-2}$ and $5\times10^{13}$ $cm^{-2}$ and at an energy level of about 30 keV.

11. The method of claim 10, wherein the first insulating layer is about three or more times as thick as the second insulating layer.

12. The method of claim 11, wherein the first and second insulating layers have thicknesses of about 350 Å and 120 Å, respectively.

13. The method of claim 1, wherein said step of forming first and second insulating layers comprises the steps of:
    forming a sacrificial oxide layer on the face at the first location;
    implanting first threshold adjust dopants of second conductivity type through the sacrificial oxide layer and into the face at the first location;
    removing the sacrificial oxide layer;
    forming a first gate oxide layer having a first thickness on the face at the first and second locations;
    selectively implanting second threshold adjust dopants of second conductivity type through the first gate oxide layer and into the face at the second location, but not into the face at the first location;
    removing the first gate oxide layer from the face at the second location, but not at the first location; and
    forming a second gate oxide layer having a second thickness less than about one half the first thickness, on the face at the second location.

14. The method of claim 1, wherein said step of forming first and second insulating layers comprises forming first and second insulating layers having thicknesses of about 350 Å and 120 Å, respectively, by:
    forming a sacrificial oxide layer on the face at the first location;
    implanting first threshold adjust dopants of second conductivity type through the sacrificial oxide layer and into the face at the first location;
    removing the sacrificial oxide layer;
    forming a first gate oxide layer having a thickness of about 300 Å on the face at the first and second locations, by thermal oxidation;
    selectively implanting second threshold adjust dopants of second conductivity type through the first gate oxide layer and into the face at the second location, but not into the face at the first location;
    removing the first gate oxide layer from the face at the second location, but not at the first location; and
    forming a second gate oxide layer having a thickness of about 120 Å on the face at the second location, by thermal oxidation.

15. The method of claim 14, wherein said steps implanting first and second threshold adjust dopants comprises implanting boron ions at a dose level of about $6\times10^{11}$ cm$^{-2}$ and $1\times10^{12}$ cm$^{-2}$, respectively.

16. The method of claim 14, wherein said active region forming step comprises implanting ions at a dose level in a range between about $1\times10^{13}$ cm$^{-2}$ and $5\times10^{13}$ cm$^{-2}$ and at a predetermined energy level so that the average projection range is between about 120 Å and 200 Å.

17. The method of claim 1, wherein said step of forming an active region is preceded by the step of forming a third insulating layer on the first insulating layer, opposite the deep source and drain regions, by wet oxidation.

18. The method of claim 17, wherein said step of forming a third insulating layer comprises forming a third insulating layer having a thickness greater than about 100 Å on the first and second insulating layers.

19. The method of claim 18, wherein said active region forming step comprises forming an active region of a second semiconductor device at the second location by implanting active region dopants of first conductivity type at a predetermined energy level through the third insulating layer and into the first and second insulating layers, so that an average projection range of the implanted active region dopants is greater that the thickness of the first insulating layer and the combined thicknesses of the second and third insulating layers, but less than the combined thicknesses of the first and third insulating layers.

20. The method of claim 19, wherein said step of implanting active region dopants comprises implanting phosphorus ions.

21. The method of claim 14, wherein said step of forming an active region is preceded by the step of forming a third insulating layer on the first insulating layer, opposite the deep source and drain regions, by wet oxidation.

22. The method of claim 21, wherein said step of forming a third insulating layer comprises forming a third insulating layer having a thickness greater than about 100 Å on the first and second insulating layers.

23. The method of claim 22, wherein said active region forming step comprises forming an active region of a second semiconductor device at the second location by implanting active region dopants of first conductivity type at a predetermined energy level through the third insulating layer and into the first and second insulating layers, so that an average projection range of the implanted active region dopants is greater that the thickness of the first insulating layer and the combined thicknesses of the second and third insulating layers, but less than the combined thicknesses of the first and third insulating layers.

24. The method of claim 23, wherein said step of implanting active region dopants comprises implanting phosphorus ions.

25. A method of forming an integrated circuit containing high and low voltage insulated-gate field effect transistors (IGFET) therein, comprising the steps of:

forming first and second insulating layers having unequal thicknesses at first and second locations on a face of a semiconductor substrate, respectively;

forming first and second gate electrodes on the first and second insulating layers, respectively;

forming deep source and drain regions of a high voltage IGFET by implanting first dopants of first conductivity type through the first insulating layer and into the first location, using the first gate electrode as an implant mask;

forming shallow source and drain regions of a low voltage IGFET at the second location by implanting second dopants of first conductivity type at a predetermined energy level into the first and second insulating layers so that an average projection range of the implanted second dopants is greater than the thickness of the second insulating layer but less than the thickness of the first insulating layer, using the first and second gate electrodes as an implant mask;

forming sidewall spacers at ends of the first and second gate electrodes; and implanting dopants of first conductivity type into the shallow and deep source and drain regions of the low and high voltage IGFETs, respectively, using the sidewall spacers on the first and second gate electrodes as implant masks.

26. The method of claim 25, wherein said step of forming first and second insulating layers comprises:

forming a sacrificial oxide layer on the face at the first location;

implanting first threshold adjust dopants of second conductivity type through the sacrificial oxide layer and into the face at the first location;

removing the sacrificial oxide layer;

forming a first gate oxide layer on the face at the first and second locations, by thermal oxidation;

selectively implanting second threshold adjust dopants of second conductivity type through the first gate oxide layer and into the face at the second location, but not into the face at the first location;

removing the first gate oxide layer from the face at the second location, but not at the first location; and forming a second gate oxide layer on the face at the second location, by thermal oxidation.

27. The method of claim 24, wherein said step of forming a first gate oxide layer comprises forming a first gate oxide layer having a thickness of about 300 Å; wherein said step of forming a second gate oxide layer comprises forming a second gate oxide layer having a thickness of about 120 Å; wherein said step of forming first and second gate electrodes comprises forming first and second gate electrodes on the first and second gate oxide layers; and wherein said shallow source and drain region forming step comprises implanting second dopants of first conductivity type at a dose level in a range between about $1\times10^{13}$ cm$^{-2}$ and $5\times10^{13}$ cm$^{-2}$ and at a predetermined energy level so that an average projection range of the implanted second dopants is between about 120 Å and 200 Å.

28. The method of claim 27, wherein said steps implanting first and second threshold adjust dopants comprises implanting boron ions at a dose level of about $6\times10^{11}$ cm$^{-2}$ and $1\times10^{12}$ cm$^{-2}$, respectively.

29. The method of claim 26, wherein said step of forming shallow source and drain regions is preceded by the step of forming a third insulating layer on the first and second insulating layers, by wet oxidation.

30. The method of claim 29, wherein said step of forming shallow source and drain regions comprises implanting second dopants at a predetermined energy level through the third insulating layer and into the first and second insulating layers, so that an average projection range of the implanted shallow source and drain region dopants is greater that the thickness of the first insulating layer and the combined thicknesses of the second and third insulating layers, but less than the combined thicknesses of the first and third insulating layers.

* * * * *